(12) United States Patent
Geissler et al.

(10) Patent No.: US 7,433,232 B2
(45) Date of Patent: Oct. 7, 2008

(54) MEMORY TRANSISTOR AND MEMORY UNIT WITH ASYMMETRICAL POCKET DOPING REGION

(75) Inventors: Christian Geissler, Regensburg (DE); Franz Schuler, Dresden (DE); Danny Pak-Chum Shum, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 100 days.

(21) Appl. No.: 11/431,265

(22) Filed: May 10, 2006

(65) Prior Publication Data

US 2007/0080390 A1 Apr. 12, 2007

Related U.S. Application Data

(63) Continuation of application No. PCT/EP2004/052623, filed on Oct. 22, 2004.

(30) Foreign Application Priority Data

Nov. 12, 2003 (DE) ................. 103 52 785

(51) Int. Cl.
*G11C 16/04* (2006.01)
(52) U.S. Cl. .............. 365/185.17; 365/185.05
(58) Field of Classification Search ........... 365/185.17, 365/185.05, 185.11
See application file for complete search history.

(56) References Cited

U.S. PATENT DOCUMENTS

| 5,912,488 | A | | 6/1999 | Kim et al. |
| 5,920,776 | A | * | 7/1999 | Fratin et al. ............ 438/257 |
| 6,028,788 | A | * | 2/2000 | Choi et al. ............. 365/185.11 |
| 6,282,123 | B1 | | 8/2001 | Mehta |
| 6,518,122 | B1 | | 2/2003 | Chan et al. |
| 2002/0098651 | A1 | | 7/2002 | Yim et al. |
| 2003/0133353 | A1 | | 7/2003 | Kato et al. |

FOREIGN PATENT DOCUMENTS

| DE | 43 44 285 A1 | 11/1994 |
| DE | 196 00 544 A1 | 12/1996 |

(Continued)

OTHER PUBLICATIONS

Process And Device Technologies For 16mbit EPROMs With Large-Tilt-Angle Implanted P-Pocket Cell, Toshiba Microelectronics Corp., 1990.

*Primary Examiner*—Vu A Le
(74) *Attorney, Agent, or Firm*—Brinks Hofer Gilson & Lione

(57) ABSTRACT

An integrated memory transistor and a memory unit including a plurality of integrated memory transistors is disclosed. Generally, the integrated memory transistor includes an electron source, a channel region, a control region, a charge storage region, a source-side pocket doping region, and a drain-side pocket doping region. The electron source is operable to transport electrons to the channel region when the integrated memory transistor operates in a read mode. Further, the electron source includes a drain terminal region and a source terminal region. The channel region is arranged between the drain terminal region and source terminal region. The charge storage region is arranged between the control region and the channel region. The source-side doping region is arranged nearer to the source terminal region than to the drain terminal region. The drain-side pocket doping region is arranged asymmetrical to the source-side pocket doping region.

35 Claims, 3 Drawing Sheets

FOREIGN PATENT DOCUMENTS

| | | |
|---|---|---|
| EP | 0 349 774 A2 | 1/1990 |
| EP | 0 582 991 B1 | 2/1994 |
| EP | 0 718 895 B1 | 6/1996 |
| EP | 0 944 094 B1 | 9/1999 |
| WO | WO 00/38240 | 6/2000 |

* cited by examiner

MEMORY TRANSISTOR AND MEMORY UNIT WITH ASYMMETRICAL POCKET DOPING REGION

RELATED APPLICATIONS

The present application is a continuation of PCT Application No. PCT/EP2004/052623, filed Oct. 22, 2004, which claims priority to DE 10352785.0, filed Nov. 12, 2003, the entirety of both of which are hereby incorporated herein by reference.

SUMMARY

The current disclosure relates to an integrated memory transistor, formed e.g. in a semiconductor substrate, having:
- Two terminal regions, which are usually doped with a doping type that deviates from the doping type of a channel region and are referred to as source region and drain region. If appropriate, the terminal regions also contain extensions that are more lightly doped than the terminal regions.
- A channel region arranged between the terminal regions, which channel region is usually lightly doped in accordance with a substrate basic doping or in accordance with a so-called well doping and serves to form an inversion channel between the terminal regions.
- A control region, which is usually electrically conductive and is referred to as the gate.
- A charge storage region arranged between the control region and the channel region, the charge storage region usually comprises an electrically conducting or an electrically insulating material and is referred to as the floating gate.
- A pocket doping region having an identical doping type to the channel region but having a different dopant concentration than in the channel region.

Such memory transistors are used for example in FLASH-EEPROM (Electrical Erasable Programmable Read Only Memory), involving memory units that store charge in non-volatile fashion, i.e. memory that retains a charge after a supply voltage has been switched off. By way of example, the memory transistor is a so-called split gate transistor whose control region is situated beside and above the charge storage region.

The pocket doping regions are also referred to as pockets and adjoin e.g. the terminal regions or the extension thereof. The pocket doping regions prevent a premature punch-through and are formed e.g. symmetrically at or in the vicinity of the two terminal regions.

It is an object of the disclosure is to specify a memory transistor which has improved electronic properties and which requires, in particular, only a small chip area. Moreover, the intention is to specify a memory unit having such a memory transistor, an operating method and a fabrication method.

The disclosure is based on the consideration that primarily reliability problems impede miniaturization of the memory transistor. As will be explained in more detail below with reference to FIG. 2, instances of disturbing impressing of so-called hot electrons into the charge storage region occur particularly in the case of n-channel memory transistors when reading a memory transistor or a memory cell. The electrons are accelerated the greatest in the vicinity of the terminal region that operates as the drain or as the electron sink. Over the many years that constitute the required service life or charge storage time of the memory transistor, the impressing of as little as one electron per day can lead to a change in the charge state of the memory transistor, e.g. a change from the state "charge not stored" to the state "charge stored".

In order to prevent hot electrons from arising, in the case of the memory cell according to the invention, the magnitude of the field strength gradient is reduced at the drain side, so that the electric field also decreases. This is achieved by means of:
- A source-side pocket doping region arranged nearer to the source terminal region than to the drain terminal region. The source-side pocking doping region having an identical doping type to the channel region but having a preferably higher dopant concentration than in the channel region.
- By means of an asymmetrical construction of the memory transistor brought about by the absence of a second such pocket doping region nearer to the drain terminal region, the absence of the pocket on the drain side being a special case. As an alternative, a pocket is used on the drain side, too, but doped with a lower dose.
- By virtue of the fact that the source terminal region, in a read operating mode of the memory transistor, serves as an electron source, i.e. as a source, for electrons transported into the channel region.

Miniaturization of the dimensions is thus possible without decreasing reliability of the memory cell. With the dimensions remaining the same, the reliability increases.

In one development, the source-side pocket doping region or else the drain-side pocket doping region has a higher dopant concentration than the channel region in order thus to prevent a punch-through between source and drain. By way of example, the maximum dopant concentration in one region serves as a reference point in the comparison of the dopant concentrations.

In one development, the asymmetry is caused by the total absence of a drain-side pocket doping region arranged nearer to the drain terminal region than to the source terminal region and having the same doping type as the channel region but having a different dopant concentration than the channel region. The asymmetry can thus be produced in a simple manner.

In an alternative development, the asymmetry is caused by a drain-side pocket doping region that is asymmetric with respect to the source-side pocket doping region and has the same doping type as the channel region but has a different dopant concentration than the channel region, the asymmetry arising by virtue of at least one of the following features:
- By virtue of a different net dopant concentration in the drain-side pocket doping region in comparison with the net dopant concentration in the source-side pocket doping region.
- By virtue of a different form of the drain-side pocket doping region in comparison with the form of the source-side pocket doping region.
- By virtue of a different position of the drain-side pocket doping region with respect to the drain terminal region in comparison with the position of the source-side pocket doping region with respect to the source terminal region.

In one development, the terminal regions are formed symmetrically with respect to one another in relation to a mirror axis running through the center of the control region and through the center of the charge storage region. This means that additionally measures for producing asymmetry of terminal regions during the fabrication of the memory transistor are not necessary.

In an alternative development, the terminal regions are formed asymmetrically in relation to the mirror axis. The asymmetry results in improved electronic properties of the memory transistor or of a memory unit.

In one development, a terminal region in each case contains a main terminal region having a doping of a different doping type to the channel region. In the development, one terminal region or both terminal regions have an extension region containing a doping of the same doping type as the main region but with a lower dopant concentration than the main region. The function of the extension regions is to produce a connection of the terminal regions into the channel region controlled by the gate electrode or to generate a smaller field gradient in the transition from a terminal zone to the channel zone. By virtue of the asymmetrical pocket implantations, a smaller dopant gradient is generated on the drain side than on the source side. As a result, a smaller field gradient prevails on the drain side during reading than in the case of symmetrical source/drain constructions.

The disclosure additionally relates to a memory unit having a multiplicity of memory transistors according to the disclosure or the developments thereof. By way of example, the memory unit contains several million memory transistors, so that particularly high requirements are made of the reliability of the charge storage.

In one development, the memory transistors are arranged in matrix form in the memory unit, in a word line direction the control regions of memory transistors of a row of the matrix in each case being electrically conductively connected via a word line. In a bit line direction situated transversely with respect to the word line direction the drain terminal regions of a column of the matrix are in each case electrically conductively connected to one another via a bit line. The word lines are electrically conductively connected or connectable to a word line decoder. The bit lines are electrically conductively connected or connectable to a bit line decoder and/or to a sensor circuit which detects the charge state of a charge storage region. The sensor circuit is also referred to as a sense amplifier.

The memory unit is constructed e.g. according to the AND principle. However, this does not preclude constructing the memory unit in an alternative configuration in accordance with the NAND principle, in which the terminal regions of different memory transistors of a column are connected in series. In one alternative, the memory unit is constructed in accordance with an architecture with a virtual ground potential. Architectures with split gate cells may also contain memory cells according to the invention.

The disclosure additionally relates to a method for operating the memory transistor, in accordance with which method the memory transistor is programmed with a tunnelling current, no current flow occurring between source and drain apart from leakage currents. By contrast, currents of greater than 100 nanoamperes flow in the case of charge carriers being impressed on the source side (source-side injection) or in the case of programming with so-called hot or fast electrons (hot channel injection) between source and drain.

In a next development, the memory transistor is programmed with a tunnelling current that flows through an interface between the channel region and a dielectric, preferably with the same current density in the entire interface, excluding the zones in which the field is influenced by the pocket doping region. This method is also referred to as UCP (Uniform Channel Programming). In particular, this programming method does not require high field gradients for generating fast electrons or field spikes at a terminal region, so that the pocket doping region does not cause a disturbance during programming. In one configuration, tunnelling currents are also used to effect erasure.

In a next development, the memory transistor is an n-channel transistor. The following steps are performed when reading the charge state of the memory transistor:

application of a ground potential to the source terminal region, application of a positive potential to the drain terminal region, and application of a positive potential to the control or gate region, the gate potential having a greater magnitude than the positive drain potential.

By virtue of the asymmetrically arranged pocket doping region or by virtue of the pocket doping regions arranged asymmetrically with respect to one another, what is achieved in the case of this read operating mode is that the electrons in the channel region do not have enough energy to overcome the energy barrier to the charge storage region. Therefore, there is also no occurrence of disturbances to the charge state stored in the charge storage layer due to read operations, i.e. no read disturb.

The disclosure additionally relates to a method for fabricating a memory transistor with an asymmetrically arranged pocket doping region. The pocket doping region is produced by means of an inclined implantation, in which case, in one development, the drain terminal region, in the vicinity of which, after all, no pocket doping region or a pocket doping region with a lower dopant concentration is intended to be formed, is covered with a mask prior to the implantation, e.g. with a resist. As an alternative, the control region serves to shade the drain region, inclined implantation being effected only in one direction. This alternative is employed in particular e.g. in the case of a traditional AND layout, in the case of which there is an inclined implantation direction for the pocket doping regions in which all the drain regions of the memory cell array are shaded.

BRIEF DESCRIPTION OF THE DRAWINGS

The disclosure is explained below with reference to the accompanying figures, in which.

DETAILED DESCRIPTION OF THE DRAWINGS

Figure 1:
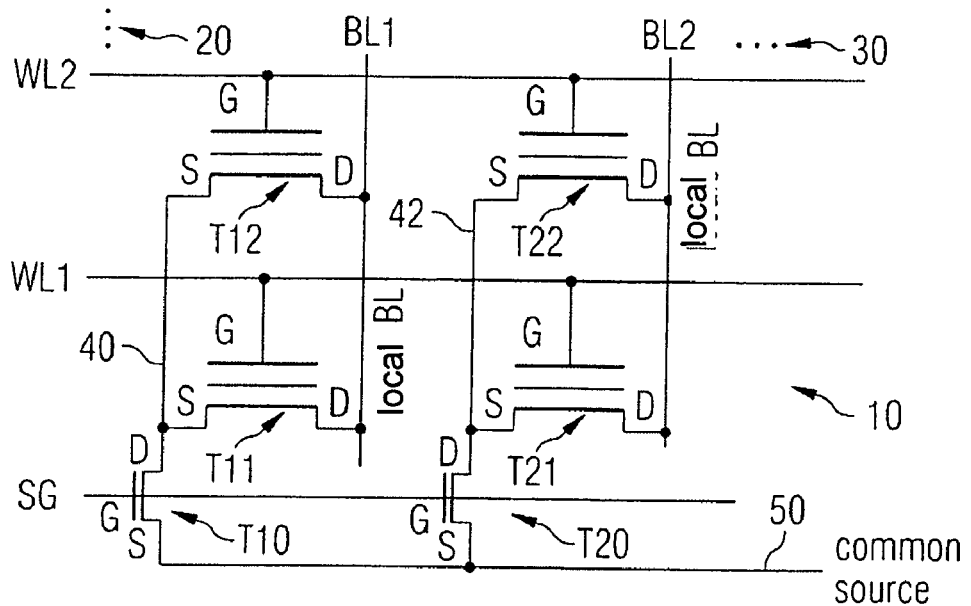
FIG. 1 shows a circuit diagram of one embodiment of a flash memory cell array.

FIG. 1 shows a circuit diagram of one embodiment of a flash memory cell array 10, in which a plurality of memory cells are arranged in matrix form in rows and columns. FIG. 1 illustrates four memory cells T11 to T22, the first index specifying the column and the second index specifying the row. For example, the memory cell T12 is situated in the first column and in the second row. The memory cells T11 to T22 are constructed identically among one another. The construction of the memory cells T11 and T13 is explained in more detail below with reference to FIGS. 2 and 3.

Two rows of the matrix are illustrated in the exemplary embodiment. The memory cells T11, T12 of the first row are connected at their gate electrodes by a word line WL1 situated in the row direction. Adjacent to the word line WL1 is a word line WL2 that likewise runs in the row direction and, inter alia, connects the gate electrodes of the memory cells T12 and T22. Further word lines 20 are indicated by dots.

Two columns of the matrix are additionally illustrated in the exemplary embodiment. The memory cells T11, T12 of the first column are connected at their drain electrodes D by a local bit line BL1 situated in the column direction. Adjacent to the local bit line BL1 is a local bit line BL2 that likewise runs in the column direction and, inter alia, connects the drain electrodes D of the memory cells T21 and T22. Further local bit lines 30 are indicated by dots. The local bit lines BL1, BL2 extend only in each case over a partial section of a column of the matrix. The local bit lines BL1, BL2 are connected via switching transistors (not illustrated) to global bit lines that extend in each case over an entire column of the matrix and are likewise not illustrated in FIG. 1 for reasons of clarity.

The source electrodes S of the memory cells of a column are connected by local source lines. Thus, the source electrodes S of the memory cells T11, T12, etc. are connected to one another by a local source line 40. The source electrodes S of the memory cells T21 and T22 of the second column are electrically conductively connected to one another via a local source line 42.

The local source lines 40, 42 respectively lead to the drain D of a switching transistor T10, T20. The gates G of the switching transistors T10, T20 are connected to a control line SG. The source terminals S of the switching transistors T10, T20 are connected to a common source line 50 carrying ground potential.

The memory unit 10 shown in FIG. 1 is a memory unit with a local AND structure. In each case e.g. eight or sixteen cells of a column form an AND structure. However, along a global bit line there are a plurality of local blocks with an AND structure.

Figure 2:
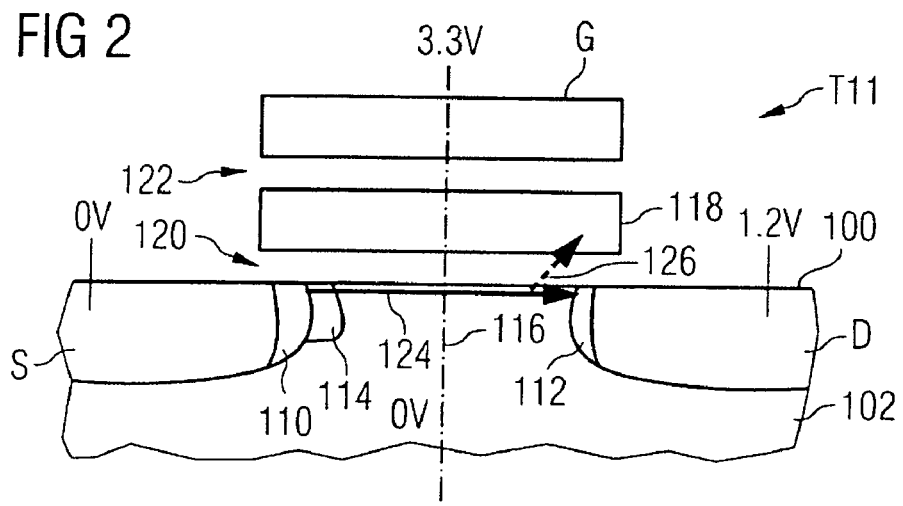
FIG. 2 shows the potential conditions at one embodiment of a memory cell during reading.

FIG. 2 shows possible potential conditions at the memory cell T11 during reading on the basis of a cross section through the memory cell T11. The memory cell T11 is situated on a silicon semiconductor substrate 100 in a weakly p-doped well 102. The source region S and the drain region D are heavily n-doped. A source extension region 110 and a drain extension region 112 are lightly n-doped. A pocket doping region 114, which is more heavily p-doped than the p-well 102, is formed only at the source extension region 110. Apart from the pocket doping region 114, the memory cell T11 is constructed mirror-symmetrically with respect to a mirror axis 116.

Situated between the substrate 100 and an electrically conducting floating gate 118 is a tunnel dielectric 120 having e.g. a thickness in the range from eight nanometers up to ten nanometers. A dielectric 122 is situated between the floating gate 118 and the gate G.

By way of example, the following potential conditions are present when reading the memory cell T11:
  0 volts or ground potential at the source S and at the well 102,
  +1.2 volts at the drain D, and
  +3.3 volts at the gate.

On account of these potential conditions, an inversion channel 124 forms at the surface of the substrate 102 between source S and drain D, electrons being accelerated from the source toward the drain in said inversion channel. A punch-through is prevented on account of the pocket doping region 114. The absence of a pocket doping region at the drain D prevents the electrons from being accelerated to an excessively great extent. Whereas it was possible for individual electrons to be impressed into the floating gate in the case of memory cells used hitherto, this is prevented in the case of the memory cell T11 on account of the absence of a pocket doping region between the symmetry or mirror axis 116 and the drain D. The memory cell T11 can therefore store its charge state unchanged over 10 years or over 15 years even if read operations are performed daily.

Figure 3:
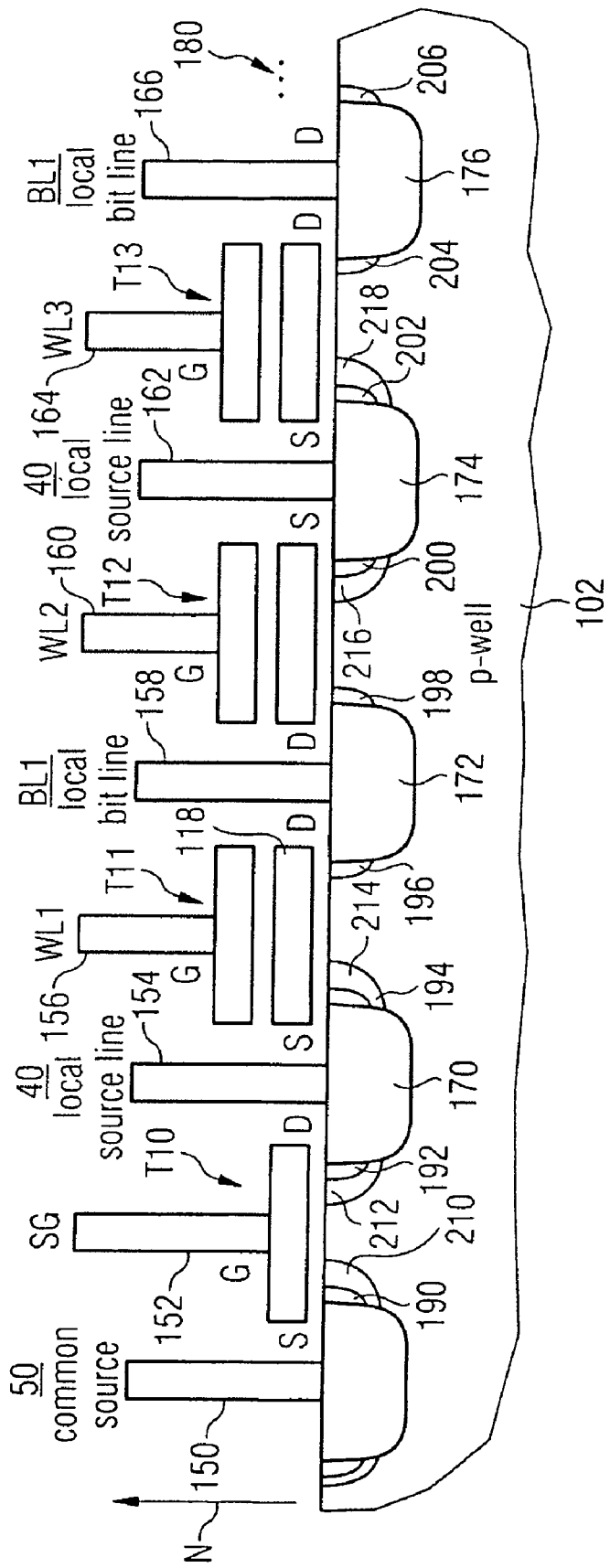
FIG. 3 shows a cross section in the bit line direction through one embodiment of the memory cell array.

FIG. 3 shows by way of example a cross section in the bit line direction through the switching transistor T10, the memory cells T11, T12 and through a memory cell T13. The local bit line BL1, the local source line 40, the control line SG and the common source line 50 are embodied e.g. in metallization layers (not illustrated). The word lines WL1, WL2 and a word line WL have been fabricated e.g. from highly doped polycrystalline silicon.

The following contacts serve for connection of the transistors T10 to T13:
  a contact 150 connected to the common source line 50 leads to the source region S of the switching transistor T10,
  a contact 152 connected to the control line SG leads to the gate G of the switching transistor T10,
  a contact 154 connected to the local source line 40 leads to an n-type doping region 170, which forms the drain D of the switching transistor T10 and the source S of the memory transistor of the memory cell T11,
  a contact 156 is situated between the word line WL1 and the gate G of the memory cell T11,
  a contact 158 is situated between the local bit line BL1 and an n-doped doping region 172, which forms the drain regions D of the memory cells T11 and T12,
  a contact 160 is situated between the word line WL2 and the gate G of the memory cell T12,
  a contact 162 connected to the local source line 40 leads to an n-type doping region 174, which forms the source S of the memory transistor of the memory cell T12 and the source S of the memory transistor of the memory cell T13,
  a contact 164 is situated between the word line WL3 and the gate G of the memory cell T13,
  a contact 166 is situated between the local bit line BL1 and an n-doped doping region 176, which forms the drain regions D of the memory cells T13 and T14,
  further contacts 180, which serve alternately for connecting a word line WLx, the source line 40, a word line WLx+1, the bit line BL1, etc.

A weakly n-doped extension region 190 is formed at the source S of the switching transistor T10. Two extension regions 192,194; 196, 198; 200, 202 and 204 and 206 that are weakly n-doped in comparison with the diffusion regions 170 to 176 are respectively formed at said diffusion regions in each case toward the two adjoining channel regions.

Situated at the extension regions 190, 192 of the switching transistor T10 is in each case a pocket doping region 210 and 212, respectively, having the opposite doping type in comparison with the extension regions 190, 192 and having the same doping type as the channel region or the p-well 102. However, the pocket doping regions 210, 212 are doped more highly than the p-well 102. Pocket doping regions 216 to 218 of the same doping type and having the same dopant concentration as the pocket doping regions 210 and 212 are situated in each case only at the source-side extension regions 194, 200, 202, etc. of the memory cells T11 to T13. By contrast, no pocket doping regions are situated at the drain-side extension regions 196,198, 204, 206, etc. With respect to the memory cell T11, FIG. 3 shows a doping profile that deviates from FIG. 2. However, both doping profiles fulfill the function of suppressing errors that was explained above with reference to FIG. 2.

The doping regions 170, 172 and 174 and also the extension regions 190 to 206 were produced with an implantation directed precisely counter to the direction of the normal N to the substrate 100. By contrast, the pocket doping regions 210 to 218 were produced with an inclined implantation whose implantation direction deviates from the angle of the perpendicular implantation by an angle of greater than 10 degrees.

Figure 4:
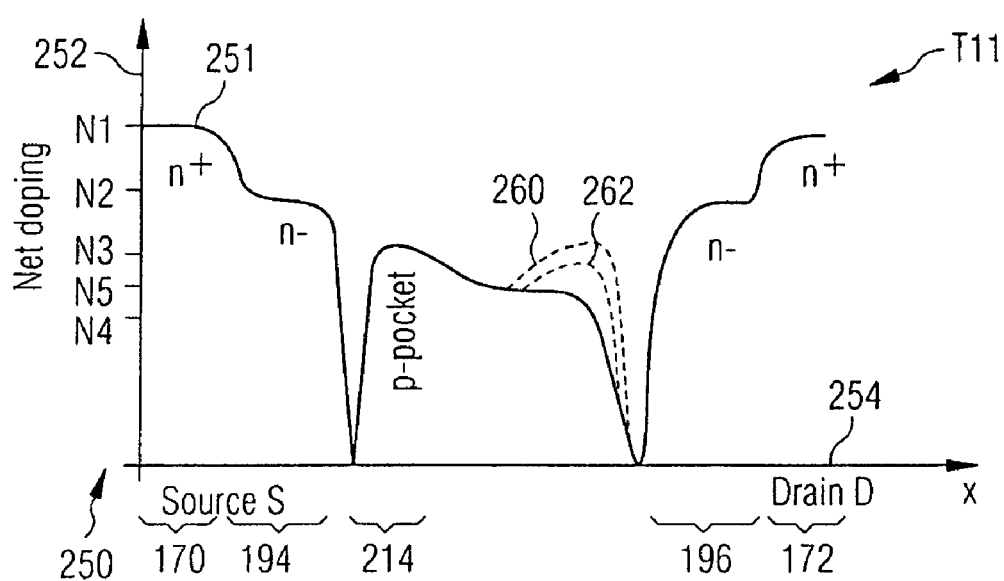
FIG. 4 shows the dopant concentration between source and drain in one embodiment of a memory cell.

FIG. 4 diagrammatically shows, in a diagram 250, a curve 251 of the magnitude of the net dopant concentration—plotted logarithmically on a y axis—as a function of a position in the bit line direction—plotted on an x axis 254. The net dopant concentration results from the difference between the dopant atoms that lead to the n conduction type and the dopant atoms that lead to the p conduction type. The net dopant concentration is plotted on the y axis 252 in the range from e.g. $10^{15}$ dopant atoms per cubic centimeter to e.g. $10^{22}$ dopant atoms per cm$^3$. The start of the x axis 254 specifies e.g. the position of the source S of the memory cell T11 in the substrate 100. The illustrated part of the x axis 254 ends at the drain D of the memory cell T11.

The curve 251 has the following continuous profile beginning from the source S as far as the drain D in the order specified:

- A high net dopant concentration N1 in the doping region 170, on account of a great predominance of e.g. arsenic or phosphorus doping atoms. The dopant concentration N1 lies e.g. in the range of $10^{20}$ to $10^{22}$ dopant atoms per cubic centimeter, and in the exemplary embodiment is 5 $10^{20}$ dopant atoms per cubic centimeter.
- A net dopant concentration N2 that is at least one power of ten lower in the extension region 194. The dopant concentration N2 is 5 $10^{19}$ dopant atoms per cubic centimeter in the exemplary embodiment.
- A net dopant concentration near $10^{15}$ dopant atoms per cubic centimeter at the transition between the extension region 194 and the pocket doping region 214.
- A local maximum of a net dopant concentration N3 approximately in the center of the pocket doping region 214, on account of a predominance of e.g. boron doping atoms. In the exemplary embodiment, N3 is e.g. 5 $10^{18}$ dopant atoms per cubic centimeter. N3 is generally at least one power of ten greater than the dopant concentration in the channel.
- A weakly falling section from the value N3 down to a dopant concentration N4 of e.g. 5 $10^{17}$ dopant atoms per cubic centimeter.
- A severely falling section from the value N4 down to the value of $10^{15}$ dopant atoms per cubic centimeter at the boundary of channel region and extension region 196.
- A rising section up to the value N2 in the extension region 196.
- The value N1 in the drain doping region 172.

The distance between the two minima and thus the channel length including the length of the pocket doping region is 120 nanometers in the exemplary embodiment. In other exemplary embodiments, the distance is also less than 120 nanometers.

A "hard" n/p junction with a great rise in net dopant concentration results at the pocket doping region 214. By contrast, the absence or the reduced doping of a pocket doping region at the extension region 196 leads to a "softer" p/n junction with a smaller fall in net dopant concentration and rise in net dopant concentration. The rise in the curve 251 in its drain-side local minimum is a measure of the field strength existing there. In the minimum at the extension region 196, the magnitudes of the rises or first derivatives of the curve 251 are small, which is associated with a reduced field strength.

The reduced field strength near the extension region 196 leads to a lower acceleration of electrons that have already been preaccelerated in the channel region in comparison with a curve profile 260—indicated by a dashed line—with two pocket doping regions that are symmetrical with respect to one another. The reduced acceleration leads to a lower velocity of the electrons at the end of the channel region. The lower velocity prevents disturbing instances of electrons being impressed into the floating gate 118 during the reading of the memory cell T11.

In an alternative exemplary embodiment, a drain-side pocket doping region 262 is used in addition to the source-side pocket doping region 114 or 214, the maximum dopant concentration N5 of which drain-side pocket doping region lies between the dopant concentration N3 and N4, e.g. halfway between N3 and N4, i.e. is 1 $10^{18}$ dopant atoms per cubic centimeter for the values mentioned above. As a result, instances of incorrect programming during reading are suppressed in this case as well. In addition, however, the punch-through voltage is increased further.

By way of example, basic dopings for the drain-side pocket doping region 262 and for the source-side pocket doping region 214 are produced by means of the same lithography, in particular by means of the same photomask, as the extension regions 110 and 112, and 190 and 192, respectively. Afterward or beforehand, the drain region or the region provided for the drain region is covered with an additional mask in order to increase the dopant concentration in the source-side pocket doping region with the aid of a further inclined implantation.

In other exemplary embodiments, a memory cell in each case contains more than one transistor, e.g. a memory transistor and a drive transistor.

Although exemplary embodiments have been explained for n-channel transistors, the technical effects also hold true for p-channel transistors. In the case of p-channel transistors, the holes are accelerated to a lesser extent during reading on account of the asymmetrical pockets, thereby avoiding damage e.g. to an oxide adjoining the channel region. Reduced degradation of the floating gate dielectric thus occurs. In the case of p-channel transistors, the potential conditions and the doping types have to be chosen oppositely to the potential conditions and doping types specified.

It is therefore intended that the foregoing detailed description be regarded as illustrative rather than limiting, and that it be understood that it is the following claims, including all equivalents, that are intended to define the spirit and scope of this invention.

The invention claimed is:

1. An integrated memory transistor comprising:
   a drain terminal region and a source terminal region;
   a channel region arranged between the drain terminal region and the source terminal region;
   a control region
   a charge storage region arranged between the control region and the channel region;
   a source-side pocket doping region arranged nearer to the source terminal region than to the drain terminal region, the source-side pocket doping region comprising the same doping type as the channel region, but a different dopant concentration than the channel region; and
   a drain-side pocket doping region arranged asymmetrical to the source-side pocket doping region, the drain-side doping region comprising the same doping type as the channel region, but a different dopant concentration;
   wherein the source terminal region transports electrons to the channel region when the integrated memory transistor operates in a read mode; and wherein the source-side pocket doping region comprises a higher dopant concentration than the drain-side pocket doping region.

2. The integrated memory transistor of claim 1, wherein the source-side pocket doping region and the drain-side pocket doping region comprise a higher dopant concentration that the channel region.

3. The memory transistor of claim 1, wherein the drain-side pocket doping region comprises a different form than the source-side pocket doping region.

4. The memory transistor of claim 1 wherein an arrangement of the drain-side pocket doping region with respect to the drain terminal region is different from an arrangement of the source-side pocket doping region with respect to the source terminal region.

5. The memory transistor of claim 1, wherein the drain terminal region is formed symmetrical to the source terminal region in relation to a mirror axis running through a center of the control region and a center of the charge storage region.

6. The memory transistor of claim 1, further comprising:
a main terminal region comprising a doping type that is different form a doping type of the channel region.

7. The memory transistor of claim 1, wherein the source-side pocket doping region comprises an extension region comprising a doping type that is the same as the doping type of the source-side pocket doping region, but a dopant concentration that is lower than the dopant concentration of the source-side pocket doping region.

8. The memory transistor of claim 1, wherein the drain-side pocket doping region comprises an extension region comprising a doping type that is the same as the doping type of the drain-side pocket doping region, but a dopant concentration that is lower than the dopant concentration of the drain-side pocket doping region.

9. A memory unit comprising:
a plurality of integrated memory transistors, each of the integrated memory transistors comprising:
a drain terminal region and a source terminal region;
a channel region arranged between the drain terminal region and the source terminal region;
a control region
a charge storage region arranged between the control region and the channel region;
a source-side pocket doping region arranged nearer to the source terminal region than to the drain terminal region, the source-side pocket doping region comprising the same doping type as the channel region, but a different dopant concentration than the channel region; and
a drain-side pocket doping region arranged asymmetrical to the source-side pocket doping region, the drain-side doping region comprising the same doping type as the channel region, but a different dopant concentration;
wherein the source terminal region transports electrons to the channel region when the integrated memory transistor operates in a read mode; and
wherein the source-side pocket doping region comprises a higher dopant concentration than the drain-side pocket doping region.

10. The memory unit of claim 9, wherein the plurality of integrated memory transistors are arranged in a matrix form.

11. The memory unit of claim 10, wherein the memory unit comprises:
a plurality of rows of integrated memory transistors of the plurality of integrated memory transistors; and
a plurality of columns of integrated memory transistors of the plurality of integrated memory transistors;
wherein the control region of each integrated memory transistor of the plurality of integrated memory transistors in a row of the plurality of rows are electrically connected by a word line;
wherein the drain terminal region of each integrated memory transistor of the plurality of integrated memory transistors in a column of the plurality of columns are electrically connected to a bit line.

12. The memory unit of claim 11, wherein each word line is electrically connected to a word line decoder and each bit line is electrically connected to a bit line decoder.

13. The memory unit of claim 11, wherein each word line is electrically connected to a word line decoder and each bit line is electrically connected to a sensor circuit that detects a charge state of each charge storage region of the plurality of integrated memory transistors.

14. The memory unit of claim 11, wherein each terminal region of the integrated memory transistors of the plurality of integrated memory transistors in a column of the plurality of columns are electrically to a source line.

15. The memory unit of claim 9, wherein at least one integrated memory transistor of the plurality of integrated memory transistors is operable to be programmed with a tunneling current to the channel region of the integrated memory transistor.

16. The memory unit of claim 15, wherein the tunneling current comprises is less than one nanoampere.

17. The memory unit of claim 16, wherein the tunneling current flows through an interface between the channel region and a dielectric of the integrated memory transistor.

18. A method for operating a memory transistor, the method comprising:
programming a memory transistor with a tunneling current;
wherein the memory transistor comprises:
a drain terminal region and a source terminal region;
a channel region arranged between the drain terminal region and the source terminal region;
a control region
a charge storage region arranged between the control region and the channel region;
a source-side pocket doping region arranged nearer to the source terminal region than to the drain terminal region, the source-side pocket doping region comprising the same doping type as the channel region, but a different dopant concentration than the channel region; and
a drain-side pocket doping region arranged asymmetrical to the source-side pocket doping region, the drain-side doping region comprising the same doping type as the channel region, but a different dopant concentration;
wherein the source terminal region transports electrons to the channel region when the integrated memory transistor operates in a read mode; and
wherein the source-side pocket doping region comprises a higher dopant concentration than the drain-side pocket doping region.

19. The method of claim 18, wherein a current flow in the channel region during programming is less than one nanoampere.

20. The method of claim 18, wherein programming a memory transistor with a tunneling current comprises:
programming the memory transistor with a tunneling current that flows through an interface between the channel region and a dielectric.

21. The method of claim 20, wherein the current flows through the entire interface with the same current density.

22. The method of claim 18, further comprising:
applying a first potential to the source terminal region;
applying a second potential that is more positive than the first potential to the drain terminal region;
applying a third potential that is more positive than the second potential to the control region; and
reading a charge state of the memory transistor.

23. The method of claim 18, further comprising
applying a first potential to the source terminal region;
applying a second potential that is more negative than the first potential to the drain terminal region;
applying a third potential that is more negative than the second potential to the control region; and
reading a charge state of the memory transistor.

24. A method for fabricating a memory transistor, the method comprising:
producing a pocket doping region of a memory transistor by an inclined implantation;
wherein the memory transistor comprises:
a drain terminal region and a source terminal region;
a channel region arranged between the drain terminal region and the source terminal region;
a control region
a charge storage region arranged between the control region and the channel region;
a source-side pocket doping region arranged nearer to the source terminal region than to the drain terminal region, the source-side pocket doping region comprising the same doping type as the channel region, but a different dopant concentration than the channel region; and
a drain-side pocket doping region arranged asymmetrical to the source-side pocket doping region, the drain-side doping region comprising the same doping type as the channel region, but a different dopant concentration;
wherein the source terminal region transports electrons to the channel region when the integrated memory transistor operates in a read mode; and
wherein the source-side pocket doping region comprises a higher dopant concentration than the drain-side pocket doping region.

25. The method of claim 24, further comprising:
covering the drain terminal region with a mask prior to the implantation.

26. The method of claim 24, further comprising:
shading the drain terminal region by a gate stack during the implantation.

27. An integrated memory transistor comprising:
a drain terminal region and a source terminal region;
a channel region arranged between the drain terminal region and the source terminal region;
a control region
a charge storage region arranged between the control region and the channel region;
a source-side pocket doping region arranged nearer to the source terminal region than to the drain terminal region, the source-side pocket doping region comprising the same doping type as the channel region, but a different dopant concentration than the channel region; and
a drain-side pocket doping region arranged asymmetrical to the source-side pocket doping region, the drain-side doping region comprising the same doping type as the channel region, but a different dopant concentration;
wherein the source terminal region transports electrons to the channel region when the integrated memory transistor operates in a read mode; and
wherein the source-side pocket doping region comprises an extension region comprising a doping type that is the same as the doping type of the source-side pocket doping region, but a dopant concentration that is lower than the dopant concentration of the source-side pocket doping region.

28. A memory unit comprising:
a plurality of integrated memory transistors, each of the integrated memory transistors comprising:
a drain terminal region and a source terminal region;
a channel region arranged between the drain terminal region and the source terminal region;
a control region
a charge storage region arranged between the control region and the channel region;
a source-side pocket doping region arranged nearer to the source terminal region than to the drain terminal region, the source-side pocket doping region comprising the same doping type as the channel region, but a different dopant concentration than the channel region; and
a drain-side pocket doping region arranged asymmetrical to the source-side pocket doping region, the drain-side doping region comprising the same doping type as the channel region, but a different dopant concentration;
wherein the source terminal region transports electrons to the channel region when the integrated memory transistor operates in a read mode; and
wherein the source-side pocket doping region comprises an extension region comprising a doping type that is the same as the doping type of the source-side pocket doping region, but a dopant concentration that is lower than the dopant concentration of the source-side pocket doping region.

29. A method for operating a memory transistor, the method comprising:
programming a memory transistor with a tunneling current;
wherein the memory transistor comprises:
a drain terminal region and a source terminal region;
a channel region arranged between the drain terminal region and the source terminal region;
a control region
a charge storage region arranged between the control region and the channel region;
a source-side pocket doping region arranged nearer to the source terminal region than to the drain terminal region, the source-side pocket doping region comprising the same doping type as the channel region, but a different dopant concentration than the channel region; and
a drain-side pocket doping region arranged asymmetrical to the source-side pocket doping region, the drain-side doping region comprising the same doping type as the channel region, but a different dopant concentration;
wherein the source terminal region transports electrons to the channel region when the integrated memory transistor operates in a read mode; and
wherein the source-side pocket doping region comprises an extension region comprising a doping type that is the same as the doping type of the source-side pocket doping region, but a dopant concentration that is lower than the dopant concentration of the source-side pocket doping region.

30. A method for fabricating a memory transistor, the method comprising:
producing a pocket doping region of a memory transistor by an inclined implantation;
wherein the memory transistor comprises:
a drain terminal region and a source terminal region;
a channel region arranged between the drain terminal region and the source terminal region;
a control region
a charge storage region arranged between the control region and the channel region;
a source-side pocket doping region arranged nearer to the source terminal region than to the drain terminal region, the source-side pocket doping region comprising the same doping type as the channel region, but a different dopant concentration than the channel region; and
a drain-side pocket doping region arranged asymmetrical to the source-side pocket doping region, the drain-side doping region comprising the same doping type as the channel region, but a different dopant concentration;
wherein the source terminal region transports electrons to the channel region when the integrated memory transistor operates in a read mode; and
wherein the source-side pocket doping region comprises an extension region comprising a doping type that is the same as the doping type of the source-side pocket doping region, but a dopant concentration that is lower than the dopant concentration of the source-side pocket doping region.

31. An integrated memory transistor comprising:
a drain terminal region and a source terminal region;
a channel region arranged between the drain terminal region and the source terminal region;
a control region
a charge storage region arranged between the control region and the channel region;
a source-side pocket doping region arranged nearer to the source terminal region than to the drain terminal region, the source-side pocket doping region comprising the same doping type as the channel region, but a different dopant concentration than the channel region; and
a drain-side pocket doping region arranged asymmetrical to the source-side pocket doping region, the drain-side doping region comprising the same doping type as the channel region, but a different dopant concentration;
wherein the source terminal region transports electrons to the channel region when the integrated memory transistor operates in a read mode; and
wherein the drain-side pocket doping region comprises an extension region comprising a doping type that is the same as the doping type of the drain-side pocket doping region, but a dopant concentration that is lower than the dopant concentration of the drain-side pocket doping region.

32. A memory unit comprising:
a plurality of integrated memory transistors, each of the integrated memory transistors comprising:
a drain terminal region and a source terminal region;
a channel region arranged between the drain terminal region and the source terminal region;
a control region
a charge storage region arranged between the control region and the channel region;
a source-side pocket doping region arranged nearer to the source terminal region than to the drain terminal region, the source-side pocket doping region comprising the same doping type as the channel region, but a different dopant concentration than the channel region; and
a drain-side pocket doping region arranged asymmetrical to the source-side pocket doping region, the drain-side doping region comprising the same doping type as the channel region, but a different dopant concentration;
wherein the source terminal region transports electrons to the channel region when the integrated memory transistor operates in a read mode; and
wherein the drain-side pocket doping region comprises an extension region comprising a doping type that is the same as the doping type of the drain-side pocket doping region, but a dopant concentration that is lower than the dopant concentration of the drain-side pocket doping.

33. A method for operating a memory transistor, the method comprising:
programming a memory transistor with a tunneling current;
wherein the memory transistor comprises:
a drain terminal region and a source terminal region;
a channel region arranged between the drain terminal region and the source terminal region;
a control region
a charge storage region arranged between the control region and the channel region;
a source-side pocket doping region arranged nearer to the source terminal region than to the drain terminal region, the source-side pocket doping region comprising the same doping type as the channel region, but a different dopant concentration than the channel region; and
a drain-side pocket doping region arranged asymmetrical to the source-side pocket doping region, the drain-side doping region comprising the same doping type as the channel region, but a different dopant concentration;
wherein the source terminal region transports electrons to the channel region when the integrated memory transistor operates in a read mode; and
wherein the drain-side pocket doping region comprises an extension region comprising a doping type that is the same as the doping type of the drain-side pocket doping region, but a dopant concentration that is lower than the dopant concentration of the drain-side pocket doping.

34. A method for fabricating a memory transistor, the method comprising:
producing a pocket doping region of a memory transistor by an inclined implantation;
wherein the memory transistor comprises:
a drain terminal region and a source terminal region;
a channel region arranged between the drain terminal region and the source terminal region;
a control region
a charge storage region arranged between the control region and the channel region;
a source-side pocket doping region arranged nearer to the source terminal region than to the drain terminal region, the source-side pocket doping region comprising the same doping type as the channel region, but a different dopant concentration than the channel region; and a drain-side pocket doping region arranged asymmetrical to the source-side pocket doping region, the drain-side doping region comprising the same doping type as the channel region, but a different dopant concentration;

wherein the source terminal region transports electrons to the channel region when the integrated memory transistor operates in a read mode; and wherein the drain-side pocket doping region comprises an extension region comprising a doping type that is the same as the doping type of the drain-side pocket doping region, but a dopant concentration that is lower than the dopant concentration of the drain-side pocket doping.

35. A method for operating a memory transistor, the method comprising:

programming a memory transistor with a tunneling current, wherein the memory transistor comprises:

a drain terminal region and a source terminal region;

a channel region arranged between the drain terminal region and the source terminal region;

a control region a charge storage region arranged between the control region and the channel region;

a source-side pocket doping region arranged nearer to the source terminal region than to the drain terminal region, the source-side pocket doping region comprising the same doping type as the channel region, but a different dopant concentration than the channel region; and a drain-side pocket doping region arranged asymmetrical to the source-side pocket doping region, the drain-side doping region comprising the same doping type as the channel region, but a different dopant concentration;

wherein the source terminal region transports electrons to the channel region when the integrated memory transistor operates in a read mode;

applying a first potential to the source terminal region;

applying a second potential that is more negative than the first potential to the drain terminal region;

applying a third potential that is more negative than the second potential to the control region; and reading a charge state of the memory transistor.

* * * * *